(12) United States Patent
Pawlowski

(10) Patent No.: US 11,714,714 B2
(45) Date of Patent: *Aug. 1, 2023

(54) TECHNIQUES FOR NON-DETERMINISTIC OPERATION OF A STACKED MEMORY SYSTEM

(71) Applicant: Micron Technology, Inc., Boise, ID (US)

(72) Inventor: Joseph T. Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/892,792

(22) Filed: Aug. 22, 2022

(65) Prior Publication Data

US 2022/0391285 A1 Dec. 8, 2022

Related U.S. Application Data

(63) Continuation of application No. 17/127,572, filed on Dec. 18, 2020, now Pat. No. 11,422,887.

(Continued)

(51) Int. Cl.
*G06F 11/10* (2006.01)
*G06F 11/07* (2006.01)
(Continued)

(52) U.S. Cl.
CPC ...... *G06F 11/1068* (2013.01); *G06F 11/0772* (2013.01); *G06F 11/3037* (2013.01); *G06F 13/1689* (2013.01); *G06F 13/28* (2013.01)

(58) Field of Classification Search
CPC ............ G06F 11/1068; G06F 11/0772; G06F 11/3037; G06F 13/1689; G06F 13/28
See application file for complete search history.

(56) References Cited

U.S. PATENT DOCUMENTS 10,593,380 B1  3/2020 Volpe et al.
11,422,887 B2 * 8/2022 Pawlowski ............ G06F 13/28
(Continued)

FOREIGN PATENT DOCUMENTS

CN  114846545 A  8/2022
CN  114930282 A  8/2022
(Continued)

OTHER PUBLICATIONS

"International Application Serial No. PCT/US2020/066140, International Preliminary Report on Patentability dated Jul. 7, 2022", 6 pgs.

(Continued)

*Primary Examiner* — Guy J Lamarre
(74) *Attorney, Agent, or Firm* — Schwegman Lundberg & Woessner, P.A.

(57) ABSTRACT

Techniques for non-deterministic operation of a stacked memory system are provided. In an example, a method of operating a memory package can include receiving a plurality of memory access requests for a channel at a logic die, returning first data to a host in response to a first memory access request of the plurality of memory access requests, returning an indication of data not ready to the host in response to a second memory access request of the plurality of memory access requests for second data, returning a first index to the host with the indication of data not ready, returning an indication data is ready with third data in response to a third memory access request of the plurality of memory access requests, and returning the first index with the indication of data ready.

20 Claims, 7 Drawing Sheets

Related U.S. Application Data

(60) Provisional application No. 62/953,821, filed on Dec. 26, 2019.

(51) Int. Cl.
*G06F 13/28* (2006.01)
*G06F 13/16* (2006.01)
*G06F 11/30* (2006.01)

(56) References Cited

U.S. PATENT DOCUMENTS

| | | |
|---|---|---|
| 11,455,098 B2 | 9/2022 | Pawlowski |
| 11,561,731 B2 | 1/2023 | Pawlowski |
| 2005/0091460 A1 | 4/2005 | Rotithor et al. |
| 2008/0082730 A1 | 4/2008 | Kim et al. |
| 2008/0101121 A1 | 5/2008 | Kreupl |
| 2011/0208906 A1 | 8/2011 | Gillingham |
| 2012/0063190 A1 | 3/2012 | Koh |
| 2012/0239874 A1 | 9/2012 | Lee et al. |
| 2012/0290800 A1 | 11/2012 | Krishnan et al. |
| 2013/0119542 A1 | 5/2013 | Oh |
| 2014/0181415 A1 | 6/2014 | Loh et al. |
| 2014/0195715 A1 | 7/2014 | Kim et al. |
| 2015/0100744 A1 | 4/2015 | Mirichigni et al. |
| 2015/0212738 A1 | 7/2015 | D'Eliseo et al. |
| 2015/0347226 A1 | 12/2015 | Pawlowski |
| 2015/0356048 A1 | 12/2015 | King |
| 2016/0179720 A1* | 6/2016 | Craddock ........... G06F 13/4027 710/308 |
| 2016/0283111 A1* | 9/2016 | Guo ....................... G06F 3/0655 |
| 2018/0189133 A1 | 7/2018 | Prathapan et al. |
| 2019/0018618 A1 | 1/2019 | D'Eliseo et al. |
| 2019/0102330 A1 | 4/2019 | Hasbun et al. |
| 2019/0265909 A1 | 8/2019 | Frolikov |
| 2019/0278511 A1 | 9/2019 | Lee et al. |
| 2020/0058363 A1 | 2/2020 | Jeddeloh |
| 2020/0065028 A1 | 2/2020 | Keil et al. |
| 2020/0073809 A1 | 3/2020 | Trout |
| 2020/0073811 A1 | 3/2020 | Trout |
| 2021/0117103 A1 | 4/2021 | Malladi et al. |
| 2021/0200445 A1 | 7/2021 | Pawlowski |
| 2021/0200475 A1 | 7/2021 | Pawlowski |
| 2021/0200632 A1 | 7/2021 | Pawlowski |
| 2023/0004305 A1 | 1/2023 | Pawlowski |

FOREIGN PATENT DOCUMENTS

| | | |
|---|---|---|
| CN | 115427925 A | 12/2022 |
| WO | WO-2021133687 A1 | 7/2021 |
| WO | WO-2021133690 A1 | 7/2021 |
| WO | WO-2021133692 A1 | 7/2021 |

OTHER PUBLICATIONS

"International Application Serial No. PCT/US2020/066140, International Search Report dated Apr. 15, 2021", 4 pgs.

"International Application Serial No. PCT/US2020/066140, Written Opinion dated Apr. 15, 2021", 4 pgs.

"International Application Serial No. PCT/US2020/066192, International Preliminary Report on Patentability dated Jul. 7, 2022", 6 pgs.

"International Application Serial No. PCT/US2020/066192, International Search Report dated Apr. 8, 2021", 3 pgs.

"International Application Serial No. PCT/US2020/066192, Written Opinion dated Apr. 8, 2021", 4 pgs.

"International Application Serial No. PCT/US2020/066208, International Preliminary Report on Patentability dated Jul. 7, 2022", 6 pgs.

"International Application Serial No. PCT/US2020/066208, International Search Report dated Apr. 15, 2021", 3 pgs.

"International Application Serial No. PCT/US2020/066208, Written Opinion dated Apr. 15, 2021", 4 pgs.

Hagedoom, Hilbert, "JEDEC Updates The High Bandwidth Memory Standard (HBM)", [Online]. Retrieved from the Internet: <URL: <https://www.guru3d.com/news-story/jedec-updates-the-high-bandwidth-memory-standard-(hbm).html>>, (Dec. 18, 2018), 3 pgs.

Thornton, Scott, "What is DRAM (Dynamic Random Access Memory) vs SRAM", [Online]. Retrieved from the Internet: <URL: https://www.microcontrollertips.com/dram-vssram/#:~:text=DRAM%20is%20at%20least%20ten,use%20as%20main%20processor%20memory<<, (Jun. 22, 2017), 14 pgs.

* cited by examiner

TECHNIQUES FOR NON-DETERMINISTIC OPERATION OF A STACKED MEMORY SYSTEM

PRIORITY AND RELATED APPLICATIONS

This application is a continuation of U.S. application Ser. No. 17/127,572, Dec. 18, 2020, which claims the benefit of priority to Pawlowski, U.S. Provisional Patent Application No. 62/953,821, titled, "TECHNIQUES FOR NON-DETERMINISTIC OPERATION OF A STACKED MEMORY SYSTEM, filed Dec. 26, 2019, all of which are hereby incorporated by reference herein their entirety.

TECHNICAL FIELD

The following relates generally to operating a memory array and more specifically to increasing bandwidth of a stacked memory device.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random-access memory (RAM), read only memory (ROM), DRAM, synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile.

Improving memory devices, generally, may include increasing memory cell density, increasing read/write speeds, increasing reliability, increasing data retention, reducing power consumption, or reducing manufacturing costs, among other metrics. Advancing memory technology has realized improvements for many of these metrics, however, as improvements in processing speed are developed, memory bandwidth can become a bottleneck to overall system performance improvements.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Techniques for non-deterministic operation of a stacked memory system are provided. In an example, a method of operating a memory package can include receiving a plurality of, or multiple, memory access requests for a channel at a logic die, returning first data to a host in response to a first memory access request of the plurality of memory access requests, returning an indication of data not ready to the host in response to a second memory access request of the plurality of memory access requests for second data, returning a first index to the host with the indication of data not ready, returning an indication data is ready with third data in response to a third memory access request of the plurality of memory access requests, and returning the first index with the indication of data ready.

Figure 1:
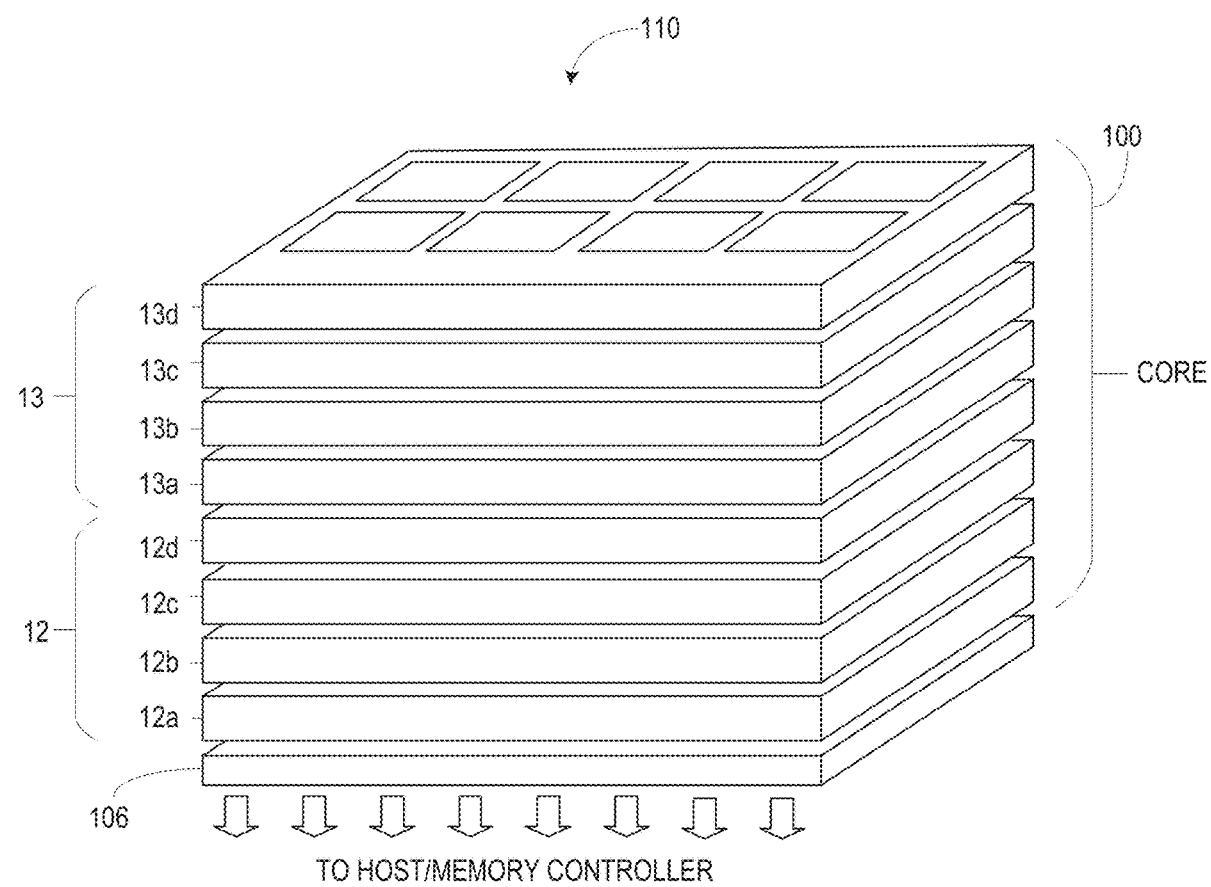
FIG. 1 illustrates an example of a memory die that supports features and operations in accordance with examples of the present disclosure.

FIG. 1 is a schematic diagram of an example memory package 110 including an interface (IF) chip 106, or circuit, and multiple of core chips 100. For example, the memory package 100 may be a 3D memory device, such as an high-bandwidth memory (HBM), a hyper memory cube (HMC), a Wide-IO DRAM etc. The memory package 110 is formed by stacking chips vertically, as shown in FIG. 1. The stacked chips may include two stacks 12 and 13 each assigned with a stack ID "0" and "1", respectively. Each stack 12 and 13 may include core chips 12 *a* to 12 *d* and 13 *a* to 13 *d*, respectively. In certain examples, each stack can have a number multiple bit channels per chip. In certain examples, each multiple bit channel can include at least 128 bits for a width of 1024 bits or more across eight channels. The interface (IF) chip 11 of the memory package 110 may provide an interface with the multiple input/output channels. In certain examples, each of the channels can function independently of each other between the core chips 12 *a* to 12 *d* and 13 *a* to 13 *d* and a host device that may be a memory controller (not shown). The IF chip 106 may couple each channel to the host device via a number of data queues (DQs). Each channel may include multiple memory cells and circuitries accessing the memory cells. For example, the memory cells may be DRAM memory cells.

Figure 2:
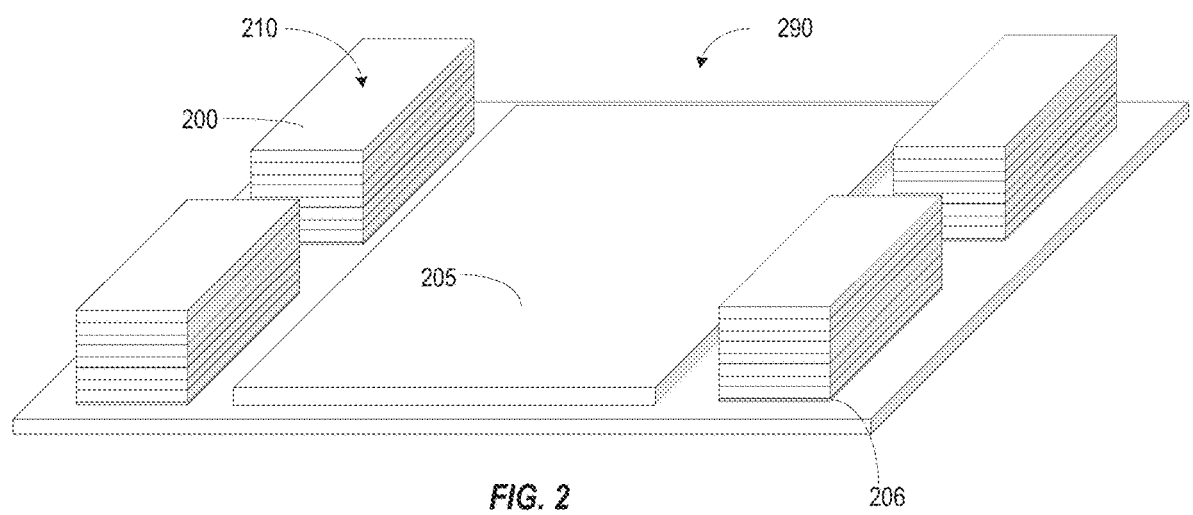
FIG. 2 illustrates generally an example of a device that supports features and operations in accordance with examples of the present disclosure.

FIG. 2 illustrates an apparatus or system 290 that supports channel routing for a memory package in accordance with various examples disclosed herein. The system 290 may include a host device 205 and multiple memory packages 210. In conventional systems, the plurality of memory devices are of the same type, such as DRAM memory devices. In certain examples, the memory devices can include a mix of capacitive based memory devices such as DRAM memory devices and cross-linked inverter memory devices such a SRAM memory devices. The present inventor has recognized that bandwidth improvements can be realized if the host has access to a second, faster type of memory, such as SRAM memory.

The host device 205 may be an example of a processor (e.g., a central processing unit (CPU), a graphics processing unit (GPU)), or a system on a chip (SoC). In some cases, the host device 205 may be a separate component from the memory device such that the host device 205 may be manufactured separately from the memory device. The host device 205 may be external to the memory device 210 (e.g., a laptop, server, personal computing device, smartphone, personal computer). In the system 290, the memory packages 210 may be configured to store data for the host device 205.

The host device 205 may exchange information with the memory packages 210 using signals communicated over signal paths. A signal path may be a path that a message or transmission may take from a transmitting component to a receiving component. In some cases, a signal path may be a conductor coupled with at least two components, where the conductor may selectively allow electrons to flow between the at least two components. The signal path may be formed in a wireless medium as in the case for wireless communications (e.g., radio frequency (RF) or optical). The signal paths may at least partially include a first substrate, such as an organic substrate of the memory device, and/or a second substrate, such as a package substrate (e.g., a second organic substrate) that may be coupled with at least one, if not both, of the memory device 210 and the host device 205. In some cases, the memory package 210 may function as a slave-type device to the host device 205, which may function as a master-type device.

In some applications, the system 290 may benefit from a high-speed connection between the host device 205 and the memory devices 210. As such, some memory packages 210 support applications, processes, host devices, or processors that have multiple terabytes per second (TB/s) bandwidth needs. Satisfying such a bandwidth constraint within an acceptable energy budget may pose challenges in certain contexts.

The memory dies 200 of the memory packages 210 may be configured to work with multiple types of communication mediums 211 (e.g., substrates such as organic substrates and/or high-density interposers such as silicon interposers). The host device 205 may, in some cases, be configured with an interface or ball-out comprising a design (e.g., a matrix or pattern) of terminals.

In some cases, a buffer layer may be positioned between the memory dies 200 and the communication medium 211. The buffer layer may be configured to drive (e.g., redrive) signals to and from the memory dies 200. In some cases, the stack of memory dies 200 may be bufferless meaning that either no buffer layer is present or that a base layer does not include re-drivers, among other components. In certain examples of bufferless memory, a routing layer or logic die 206 may be positioned between the memory die 200, or stack of memory die 200 and the communication medium 211. In certain examples, the logic die 206 can form a lower layer of a memory die 200. In certain examples, a bufferless memory package 210 can include a lower most memory die 200 having a logic die layer 206.

Figure 3:
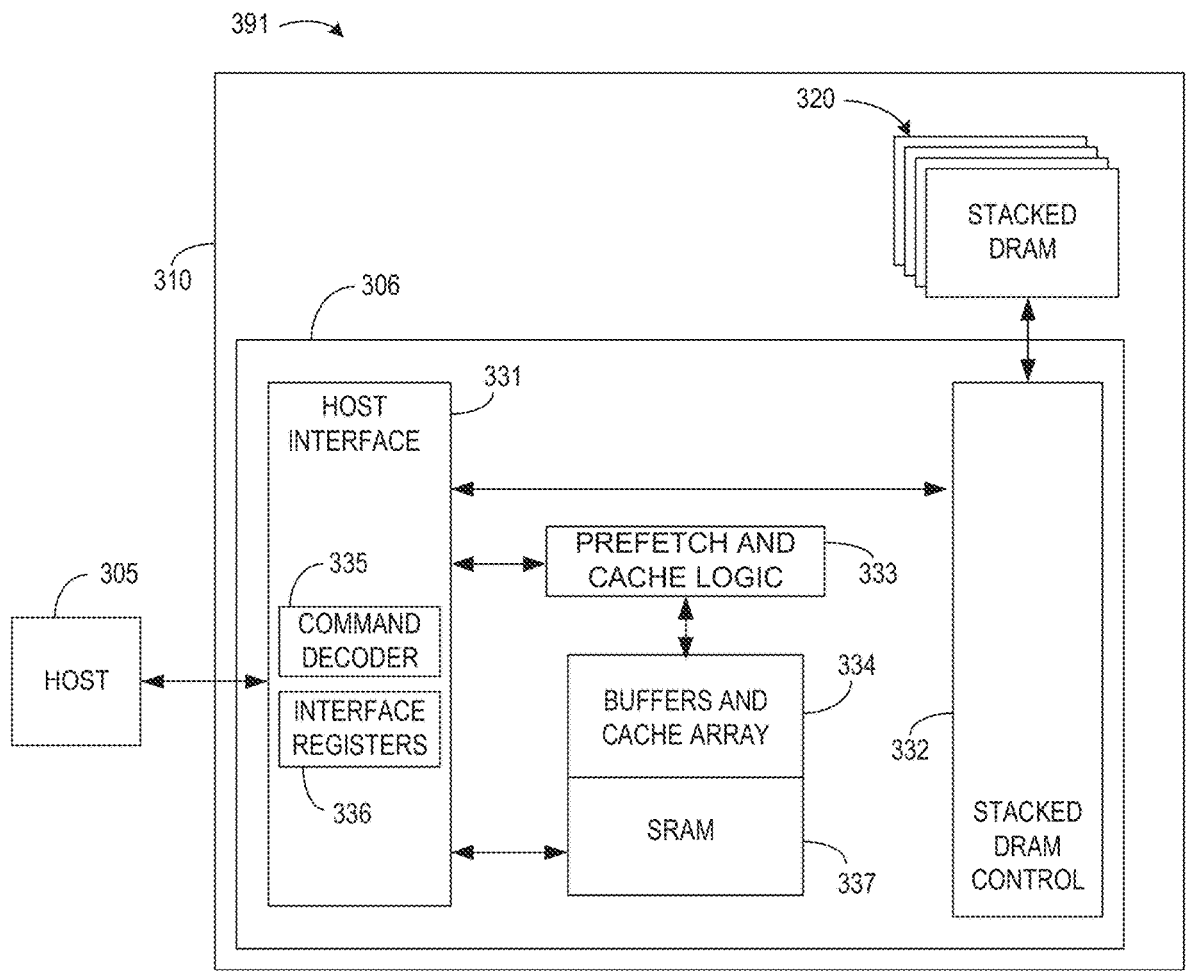
FIG. 3 illustrates generally an example storage system including a host device that can request and receive information from the storage system according to the present subject matter.

FIG. 3 illustrates generally an example storage system 391 including a host device 305 and a memory package 310. The host 305 can request and receive information from a memory package 310 according to the present subject matter using a bus external to the memory package. The host device 305 may be, but is not limited to, a CPU, graphics processing unit (GPU), accelerated processing unit (GPU), digital signal processor (DSP), field-programmable gate array (FPGA), application specific integrated circuit (ASIC) and any other component of a larger system that communicates with the storage system 310. In some embodiments, the device 305 may be multiple devices accessing the same storage system 310. The memory package 310 can include a logic die 306 integrated with a memory stack 320, such as a stack of dynamic random-access memory (DRAM) devices.

The logic die 306 can include a host interface 331 connected to a stacked DRAM control 332 and prefetch and cache logic 333. The stacked DRAM control 332 is connected to and interfaces with the memory stack 320. The prefetch and cache logic 333 can be connected with a prefetcher, prefetch buffers and a cache array 334. The prefetcher may be a hardware prefetcher. The prefetch buffers and cache array 334 may be, but is not limited to, an SRAM array, or any other memory array technology, or a register with faster access speeds than the type of memory used in the memory stack 320.

The host interface 331 can include a command decoder 335 and interface registers 336. The host interface 331, and more specifically, the command decoder 335 can receive all incoming memory requests to the memory stack 320 from the host 305. The requests can be sent to the prefetch and cache logic 333, (for example, next-line, stride, and the like). The prefetch and cache logic 333 can monitor the incoming memory requests. Prefetched data can be placed into the prefetch buffers and cache array 334. The prefetch and cache logic 333 can also check any incoming memory requests against the data in the prefetch buffers and cache array 334. Any hits can be served directly from the prefetch buffers and cache array 334 without going to the stacked DRAM control 332. This can reduce service latencies for these requests, as well as reduce contention in the stacked DRAM control 332 of any remaining requests, (i.e., those that do not hit in the prefetch buffers and cache array 334).

The prefetcher may encompass any prefetching algorithm/method or combination of algorithms/methods. Due to the row-buffer-based organization of most memory technologies, (for example, DRAM), prefetch algorithms that exploit spatial locality, (for example, next-line, small strides and the like), have relatively low overheads because the prefetch requests will (likely) hit in the memory's row buffer(s). Implementations may issue prefetch requests for large blocks of data, (i.e., more than one 64B cache line's worth of data), such as prefetching an entire row buffer, half of a row buffer, or other granularities.

The prefetch buffers and cache array 334 may be implemented as a direct-mapped, set-associative, to a fully-associative cache-like structure. In an embodiment, the prefetch buffers and cache array 334 may be used to service only read requests, (i.e., writes cause invalidations of prefetch buffer entries, or a write-through policy must be used). In another embodiment, the prefetch buffers and cache array 334 may employ replacement policies such as Least Recently Used (LRU), Least Frequency Used (LFU), or First-In-First-Out (FIFO). If the prefetch unit generates requests for data sizes larger than a cache line, the prefetch buffers and cache array 334 may also need to be organized with a correspondingly wider data block size. In some embodiments, sub-blocking may be used.

While described herein as being employed in a memory organization consisting of one logic chip and one or more memory chips, there are other physical manifestations. Although described as a vertical stack of a logic die with one or more memory chips, another embodiment may place some or all of the logic on a separate chip horizontally on an interposer or packaged together in a multi-chip module (MCM). More than one logic chip may be included in the overall stack or system.

As discussed above, the prefetch and cache logic 333 can also check any incoming memory requests against the data in the prefetch buffers and cache array 334. Any hits can be served directly from the prefetch buffers and cache array 334 without going to the stacked DRAM control 332. This can reduce service latencies for these requests, as well as reduce contention in the stacked DRAM control 332 of any remaining requests. However, prefetch or cache misses can still occur. Conventional architectures provide a data error (DERR) indication at the host interface for each channel of the memory stack when a request cannot be serviced. When a read request, for example, of the host fails to hit data associated with the prefetch or the catch, the host interface indicates the cache miss by setting the data error (DERR) indication for the corresponding channel to a respective logic level. Upon seeing the indication of the data error, the host typically moves to the next access request and then reissues the failed request at some later time.

The present inventor has recognized that a logic die having a memory-side SRAM cache as described above can operate to assist and improve accessing memory data after a missed access request. In this context a "missed access request" is one that the memory interface receives but is unable to process from the cache at that time. In certain examples, the system 391 can take advantage of the burst length of the memory system to encode additional information associated with missed access requests. Generally, burst length is the number of clock cycles a channel uses to exchange information across the data queues (DQs). In the example discussed above with respect to FIG. 1, a channel width of 32 can require eight clock cycles to provide a 128 bit channel length word, so the burst length is eight. In certain examples, each cycle of a burst length can use the physical data error (DERR) bit of each channel I/O to convey 8 bits worth of information about, for example, a true data error, whether a prior request is ready, and an index associated with a missed request. The eight bits can be transmitted serially during a burst using the physical data error bit of each channel I/O. As an example, the serial communicated bits of the physical data error I/O point (DERR) can be assigned as follows:

| Bit | Function |
|---|---|
| 0 | data error |
| 1 | not Ready |
| 2 | alert |
| 3-7 | index |

It is understood that other sequences of bits assignments are possible without departing from the scope of the present subject matter. The "data error" function a little different than conventional methods in that when a request cannot be serviced and will not be serviced, the data error bit can be activated. In such a scenario, upon receiving a "data error" indication after making a memory access request, the host will need to re-issue the memory access request at least once.

The "not ready" function, or bit, can be activated when a request is a missed request. For example, the "not ready" function/bit, can be activated when the request is received, the request is not able to service by the cache, but the interface plans to attempt to read the data associated with the missed request to the cache in the near future. In addition to activating the "not ready" function/bit, the index bits (e.g., 3-7) can provide an index number associated with the missed request on that channel. The index number can be used by the host to track and later capture the corresponding data associated with the prior missed request.

The "alert" function, or bit, can be activated when data associated with a prior missed request is available in the cache. In addition, when the alert function/bit is activated, the index bits can provide an index number corresponding to the missed request. In some examples, the host interface can provide the data in an interval immediately following the activation of the corresponding "alert" function. In some example, the "alert" function can re-initiate the missed read access request associated with the index to get the corresponding data. In certain examples, the cache can include a list of index numbers associated with pending requests.

In the above example, the burst length allows for five index bits. As such, each channel can have up to 32 (e.g., $2^5$) missed requests pending at any one time. In some examples, some of the index numbers can be assigned to convey other information and thus, the number of pending missed requests can be less. In addition, an example memory system can have a burst length or channel width different than the example above without departing from the scope of the present subject matter.

Figure 4:
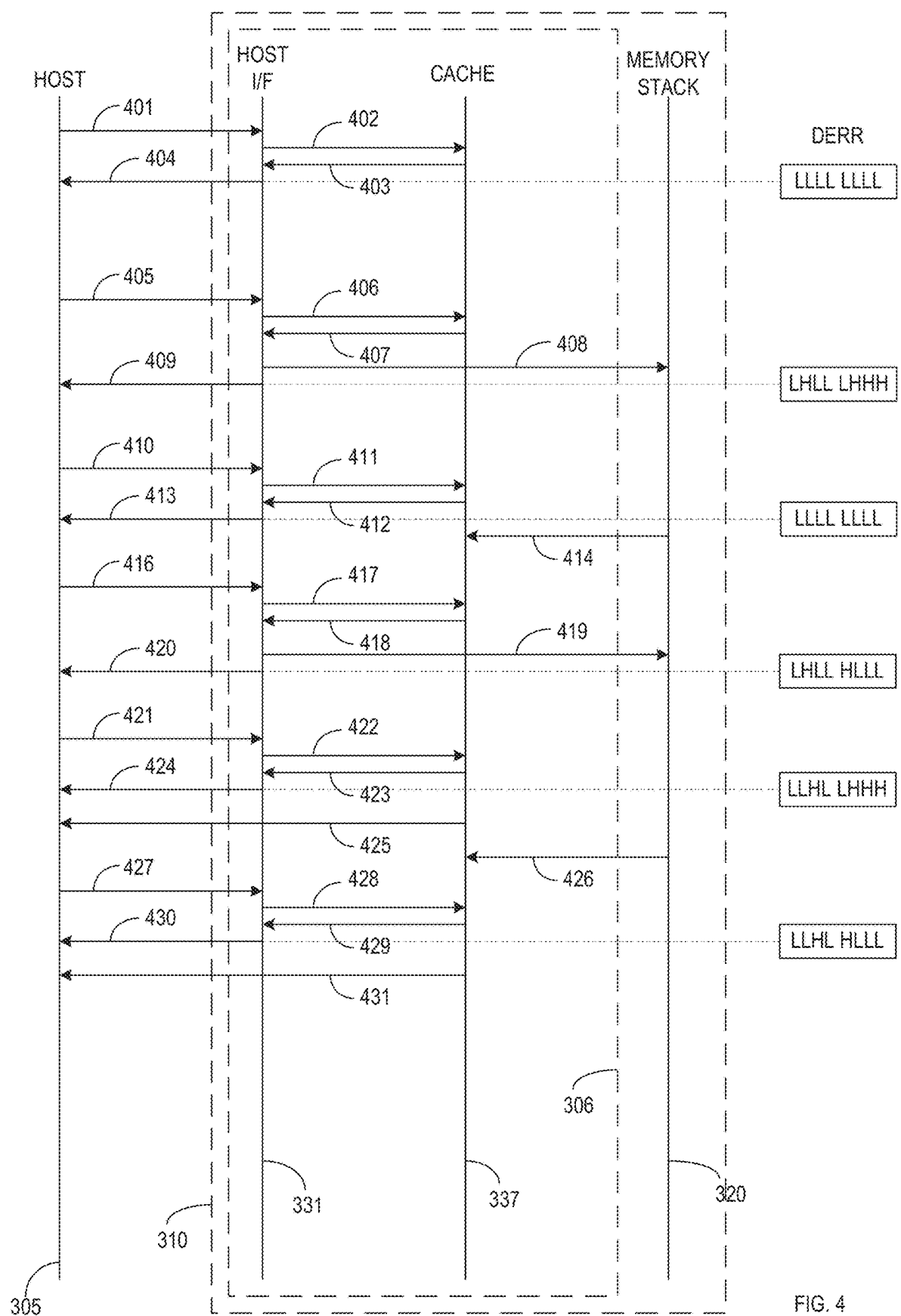
FIG. 4 illustrates generally and example time line of information flow between a host and a channel of an example memory package according to the present subject matter.

FIG. 4 illustrates generally and example time line 400 of information flow between a host 305 and a channel of an example memory package 310 according to the present subject matter. The memory package 310 can include logic die 306 and a stack of memory 320, such as a stack of DRAM. The logic die 306 can include a host interface 331 and a cache 337. In certain examples, the cache 337 can include SRAM. In certain examples, the cache 337 can include buffers and tag maps associated with conventional stacked memory devices. At 401, the host 305 can request data from the memory system and the request can be received at the host interface 331. At 402, the host interface 331 can request the data from the cache 337. At 403, after determining the data is in the cache 337, the data can be received at the host interface 331 and at 404, the data can be passed to the host 305. At 405, the host 305 can request second data from the memory system and the request can be received at the host interface 331. At 406, the host interface 331 can request the data from the cache 337. At 407, after determining the data is not in the cache 337, the status of the cache request can be received at the host interface 331. At 408, the host interface 331 can request the second data from the memory stack 320, and at 409, the missed request can be reported to the host 305.

In certain examples, at 409, when reporting the missed request, the host interface 331 can use the physical data error (DERR) output point for the channel to indicate that the request is not ready, and also to provide an index number for the request. A compatible host 305 can use the index number to later retrieve the requested data as discussed below. In certain examples, since accessing the memory stack 320 is more time consuming than servicing data requests at the cache 337, the host interface 331 can make the channel available for further data requests while the second data is being retrieved. As such, at 410, the host 305 can request third data from the memory system and the request can be received at the host interface 331. At 411, the host interface 331 can request the data from the cache 337. At 412, after determining the data is in the cache 337, the data can be received at the host interface 331 and at 413, the data can be passed to the host 305. At 414, the second data can be passed from the memory stack 320 to the cache 337. It is understood that the host interface 331 may be able to receive more than one data request from the host 305 before receiving the data of a missed request without departing from the scope of the present subject matter.

At 416, the host 305 can request fourth data from the memory system and the request can be received at the host interface 331. At 417, the host interface 331 can request the data from the cache 337. At 418, after determining the data is not in the cache 337, the status of the cache request can be received at the host interface 331. At 419, the host interface 331 can request the fourth data from the memory stack 320, and at 420, the missed request can be reported to the host 305. As before, in certain examples, at 420, when reporting the missed request, the host interface 331 can use the physical data error (DERR) output point for the channel to indicate that the request is not ready, and also to provide an index number for the request. The index number can be different than the index number associated with reporting the missing request for the second data at 409.

At 421, the host 305 can request fifth data from the memory system and the request can be received at the host interface 331. At 422, the host interface 331 can request the data from the cache 337. At 423, after determining the data is in the cache 337, the data can be received at the host interface 331 and at 424, the data can be passed to the host 305. In addition, when the fifth data is passed to the host 305, the host interface 331 can activate the "data" ready bit, or "alert" bit discussed above, during the burst and can also provide the corresponding index number for the request for the second data as the second data is now available in the cache 337. In certain examples, the cache 337 at 425 can pass the second data to the host 305 via the host interface 331. In some examples, the host interface 331 may require that the host 305 resend a request for the second data before passing the second data. In some examples, the passing the second data via the host interface 331 may involve separate transactions between the cache 337 and the host interface 331 and between the host 305 interface and the host 305, and each transaction can be separated in time different than that illustrated without departing from the scope of the present subject matter. At 426, the fourth data can be passed from the memory stack 320 to the cache 337.

At 427, the host 305 can request sixth data from the memory system and the request can be received at the host interface 331. At 428, the host interface 331 can request the sixth data from the cache 337. At 429, after determining the sixth data is in the cache 337, the sixth data can be received at the host interface 331 and at 430, the sixth data can be passed to the host 305. In addition, when the sixth data is passed to the host 305, the host interface 331 can activate a data readiness indication such as the "data ready" bit during the DERR burst and can also provide the corresponding index number for the request for the fourth data as the fourth data is now available in the cache 337. In certain examples, the cache 337 at 431 can pass the fourth data to the host 305 via the host interface 331. In some examples, the host interface 331 may require that the host 305 resend a request for the fourth data before passing the fourth data from the cache 337. In some examples, the passing the fourth data via the host interface 331 may involve separate transactions between the cache 337 and the host interface 331 and between the host interface 331 and the host 305, and each transaction can be separated in time different than that illustrated without departing from the scope of the present subject matter.

Figure 5:
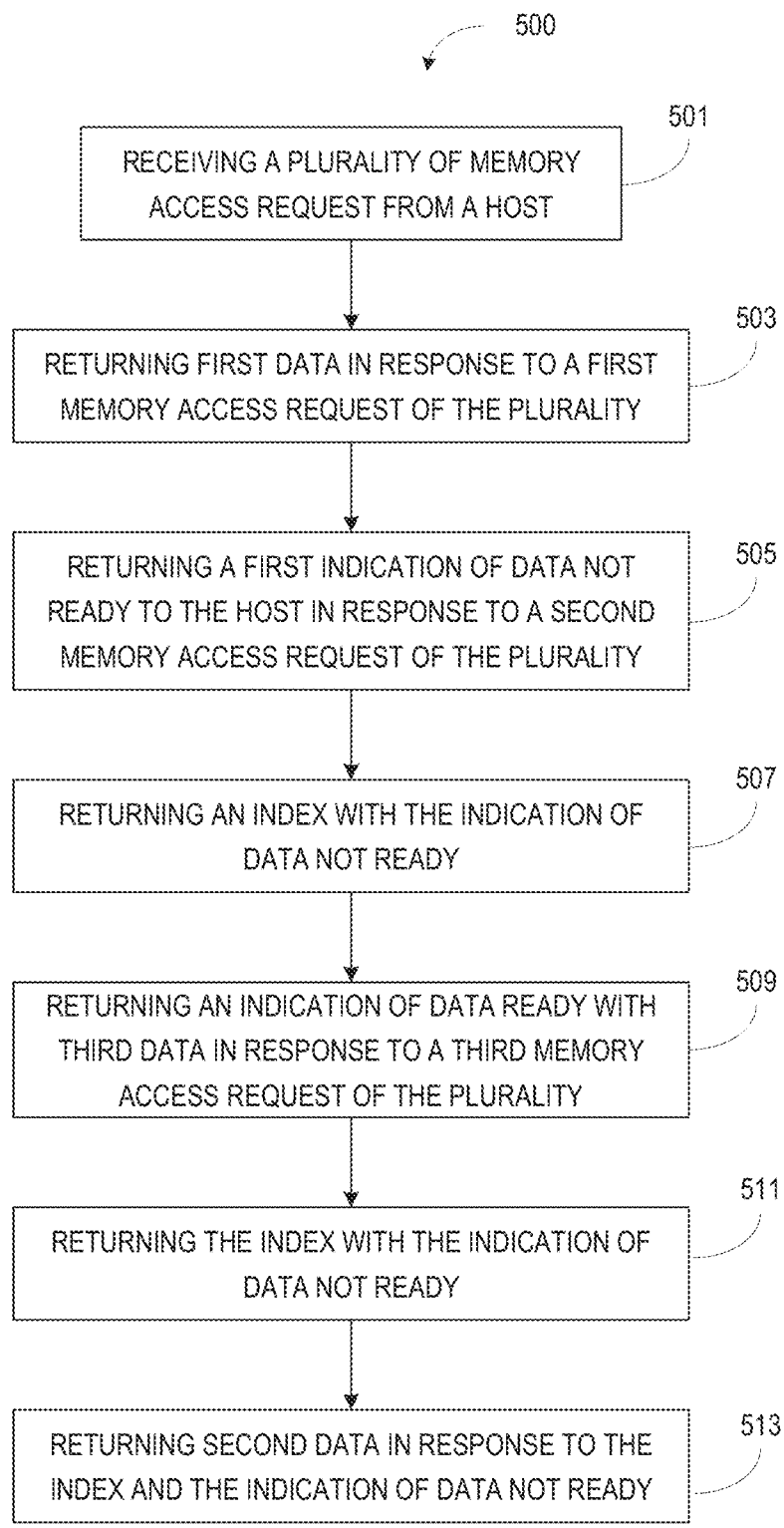
FIG. 5 illustrates generally and example method of operating a memory device according to the present subject matter.

FIG. 5 illustrates generally and example method 500 of operating a memory device according to the present subject matter. At 501, a plurality of memory access requests can be received from a host at a memory system including a stack of DRAM memory devices. At 503, first data can be returned to the host in response to a first memory access request of the plurality of memory access requests. At 505, a first indication of data not ready can be returned to the host in response to a second memory access request of the plurality of memory access requests. At 507, an index can be returned with the first indication of data not ready. At 509, an indication of data ready can be returned with third data in response to a third memory access request of the plurality of memory access requests. At 511, the first index can be returned with the indication of data ready. At 513, second data can be returned to the host in response to the indication of data ready and the first index received with the third memory access request.

Figure 6:
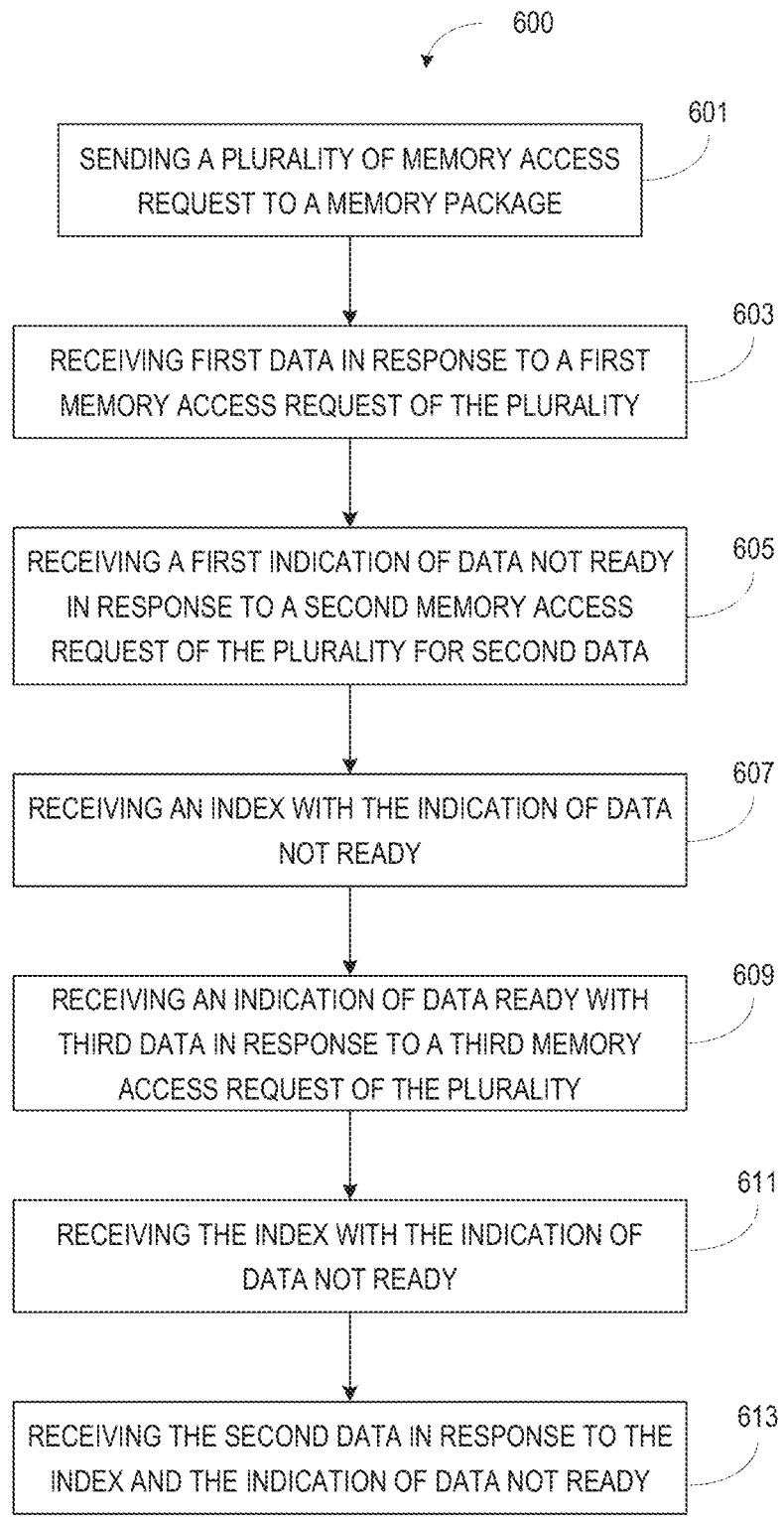
FIG. 6 illustrates an example method of operating a host according to the present subject matter.

FIG. 6 illustrates an example method 600 of operating a host according to the present subject matter. At 601, multiple memory access requests can be sent to a memory system having a stack of memory devices. At 603, first data can be received in response to a first request of the multiple memory access requests. At 605, an indication of data not ready can be received in response to a second request of the multiple memory access requests, wherein the second request is a request for second data. At 607, an index can be received with the indication of data not ready. At 609, third data can be received in response to a third request of the multiple memory access requests. At 611, an indication of data ready and the index can be received with the third data. At 613, the second data can be received in response to the indication of data ready and the index.

Figure 7:
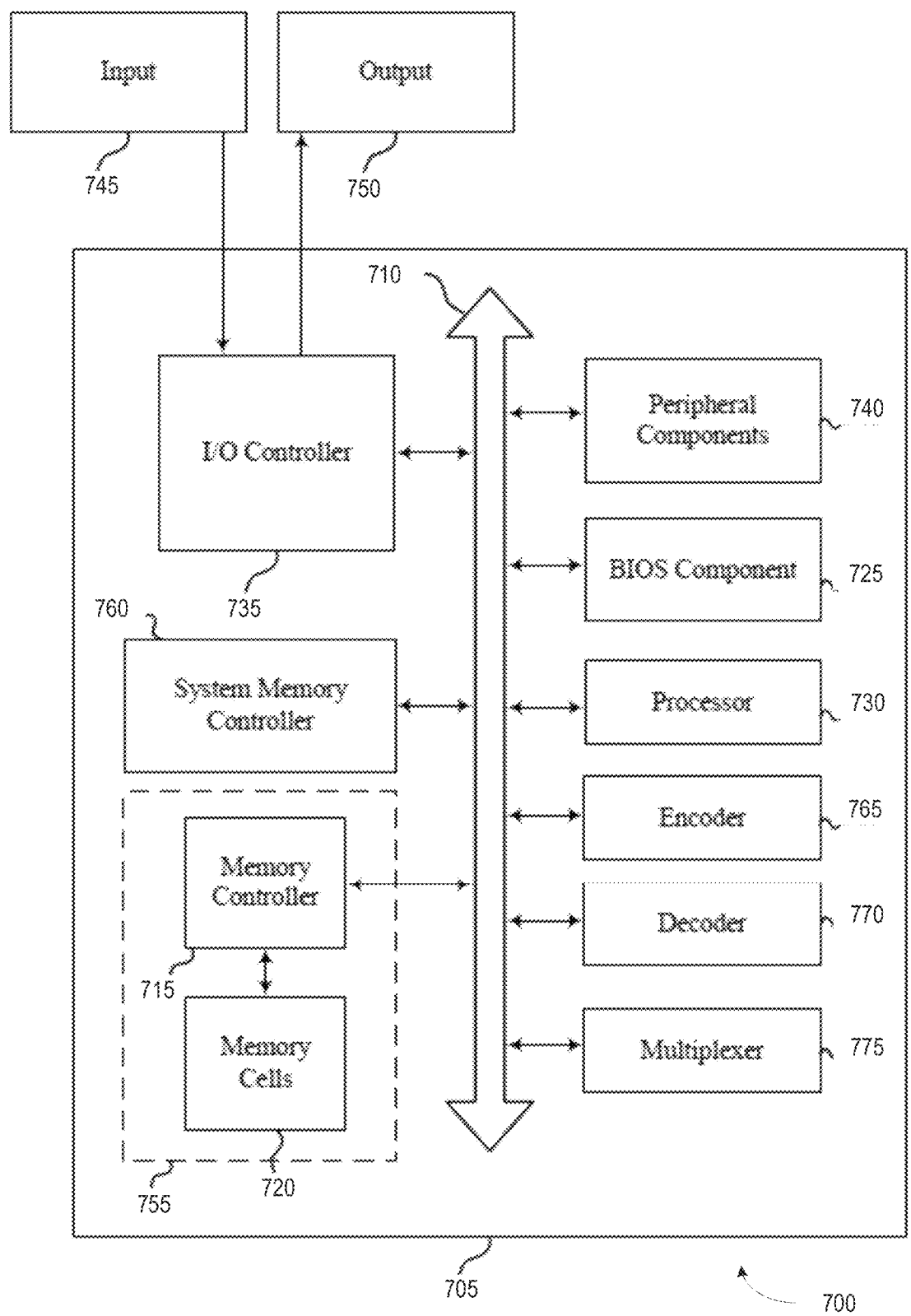
FIG. 7 illustrates generally a diagram of a system including a device that supports a storage system including stacked DRAM devices in accordance with aspects disclosed herein.

FIG. 7 illustrates generally a diagram of a system 700 including a device 705 that supports a storage system including stacked DRAM devices in accordance with aspects disclosed herein. Device 705 may include components for bi-directional voice and data communications including components for transmitting and receiving communications, including memory controller 715, memory cells 720, basic input/output system (BIOS) component 725, processor 730, I/O controller 735, peripheral components 740, memory chip 755, system memory controller 760, encoder 765, decoder 770, and multiplexer 775. These components may be in electronic communication via one or more busses (e.g., bus 710). Bus 710, for example, may have a bus width of 16 data lines ("DQ" lines). Bus 710 may be in electronic communication with 32 banks of memory cells.

Memory controller 715 or 760 may operate one or more memory cells as described herein. Specifically, memory controller may be configured to support flexible multi-channel memory. In some cases, memory controller 715 or 760 may operate a row decoder, column decoder, or both, as described with reference to FIG. 1. Memory controller 715 or 760 may be in electronic communication with a host and may be configured to transfer data during each of a rising edge and a falling edge of a clock signal of the memory controller 715 or 760.

Memory cells 720 may store information (i.e., in the form of a logical state) as described herein. Memory cells 720 may represent, for example, memory cells 105 described with reference to FIG. 1. Memory cells 720 may be in electronic communication with memory controller 715 or 760, and memory cells 720 and memory controller 715 or 760 may be located on a chip 755, which may be one or several planar memory devices as described herein. Chip 755 may, for example, be managed by system memory controller 715 or 760.

Memory cells 720 may represent a first array of memory cells with a plurality of regions coupled to a substrate. Each region of the plurality of regions may include a plurality of banks of memory cells and a plurality of channels traversing the first array of memory cells. At least one of the plurality of channels may be coupled to at least one region. Memory controller 715 or 760 may be configured to transfer data between the coupled region and the memory controller 715 or 760.

BIOS component 725 be a software component that includes BIOS operated as firmware, which may initialize and run various hardware components. BIOS component 725 may also manage data flow between a processor and various other components, e.g., peripheral components, input/output control component, etc. BIOS component 725 may include a program or software stored in read only memory (ROM), flash memory, or any other non-volatile memory.

Processor 730 may include an intelligent hardware device, (e.g., a general-purpose processor, a digital signal processor (DSP), a central processing unit (CPU), a microcontroller, an application-specific integrated circuit (ASIC), a field programmable gate array (FPGA), a programmable logic device, a discrete gate or transistor logic component, a discrete hardware component, or any combination thereof). In some cases, processor 730 may be configured to operate a memory array using a memory controller 715 or 760. In other cases, a memory controller 715 or 760 may be integrated into processor 730. Processor 730 may be configured to execute computer-readable instructions stored in a memory to perform various functions (e.g., functions or tasks supporting flexible multi-channel memory).

I/O controller 735 may manage input and output signals for device 705. I/O controller 735 may also manage peripherals not integrated into device 705. In some cases, I/O controller 735 may represent a physical connection or port to an external peripheral. I/O controller 735 may utilize an operating system such as iOS®, ANDROID®, MS-DOS®, MS-WINDOWS®, OS/2®, UNIX®, LINUX®, or another known operating system. In other cases, I/O controller 735 may represent or interact with a modem, a keyboard, a mouse, a touchscreen, or a similar device. In some cases, I/O controller 735 may be implemented as part of a processor. A user may interact with device 705 via I/O controller 735 or via hardware components controlled by I/O controller 735.

Peripheral components 740 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 745 may represent a device or signal external to device 705 that provides input to device 705 or its components. This may include a user interface or an interface with or between other devices. In some cases, input 745 may be managed by I/O controller 735, and may interact with device 705 via a peripheral component 740.

Output 750 may also represent a device or signal external to device 705 configured to receive output from device 705 or any of its components. Examples of output 750 may include a graphics display, audio speakers, a printing device, another processor or printed circuit board, etc. In some cases, output 750 may be a peripheral element that interfaces with device 705 via peripheral component(s) 740. Output 750 may be managed by I/O controller 735.

System memory controller 715 or 760 may be in electronic communication with a first array of memory cells (e.g., memory cells 720). A host may be a component or device that controls or directs operations for a device of which memory controller 715 or 760 and corresponding memory array are a part. A host may be a component of a computer, mobile device, or the like. Or device 705 may be referred to as a host. In some examples, system memory controller 715 or 760 is a GPU.

Encoder 765 may represent a device or signal external to device 705 that provides performs error correction encoding on data to be stored to device 705 or its components. Encoder 765 may write the encoded data to the at least one selected memory via the at least one channel and may also encode data via error correction coding.

Decoder 770 may represent a device or signal external to device 705 that sequences command signals and addressing signals to device 705 or its components.

In some examples, memory controller 715 or 760 may be co-located within decoder 770.

Multiplexer 775 may represent a device or signal external to device 705 that multiplexes data to device 705 or its components. Multiplexer 775 may multiplex the data to be transmitted to the encoder 765 and de-multiplex data received from the encoder 765. A multiplexer 775 may be in electronic communication with the decoder 770. In some examples, multiplexer 775 may be in electronic communication with a controller, such as system memory controller 715 or 760.

The components of device 705 may include circuitry designed to carry out their functions. This may include various circuit elements, for example, conductive lines, transistors, capacitors, inductors, resistors, amplifiers, or other active or inactive elements, configured to carry out the functions described herein. Device 705 may be a computer, a server, a laptop computer, a notebook computer, a tablet computer, a mobile phone, a wearable electronic device, a personal electronic device, or the like. Or device 705 may be a portion or aspect of such a device. In some examples, device 705 is an aspect of a computer with high reliability, mission critical, or low latency constraints or parameters, such as a vehicle (e.g., an autonomous automobile, airplane, a spacecraft, or the like). Device 705 may be or include logic for artificial intelligence (AI), augmented reality (AR), or virtual reality (VR) applications.

In one example, a memory device may include an array of memory cells with a plurality of regions that may each may include a plurality of banks of memory cells, and a plurality of channels traversing the array of memory cells. Each of the channels may be coupled with a region of the array of memory cells and may be configured to communicate signals between the plurality of banks of memory cells in the region with a host device.

In some examples, the memory device may further include I/O areas extending across the array of memory cells, the I/O areas occupying an area of the array of memory cells that may be devoid of memory cells. In some examples of the memory device, the I/O areas may include TSVs configured to couple the array of memory cells with a power node or a ground node.

In some examples, the memory device may further include a plurality of channel interfaces distributed in the array of memory cells. In some examples of the memory device, the plurality of channel interfaces may be bump-outs. In some examples of the memory device, a channel interface of the plurality of channel interfaces may be positioned in each quadrant of the array of memory cells.

In some examples, the memory device may further include a plurality of signal paths extending between memory cells of the region and a channel interface associated with the region. In some examples of the memory device, the channel interface may be positioned in the array of memory cells to minimize a length of the signal paths.

In some examples, the memory device may further include a second array of memory cells stacked on top of the array of memory cells. In some examples of the memory device, the second array of memory cells may have regions that may each include a plurality of banks of memory cells. In some examples, the memory device may further include a second plurality of channels traversing the second array of memory cells. In some examples of the memory device, each of the channels of the second plurality of channels may be coupled with a second region of the second array of memory cells and may be configured to communicate signals between the plurality of banks of memory cells in the second region with the host device.

In some examples, the memory device may further include TSVs extending through the array of memory cells to couple the second array of memory cells with the second plurality of channels. In some examples of the memory device, a channel may establish a point-to-point connection between the region and the host device. In some examples of the memory device, each channel may include four or eight data pins. In some examples of the memory device, the region of the array of memory cells may include eight or more banks of memory cells.

In some examples, the memory device may further include an interface configured for bidirectional communication with the host device. In some examples of the memory device, the interface may be configured to communicate signals modulated using at least one of a NRZ modulation scheme or a PAM4 scheme, or both.

In one example, a memory device may include an array of memory cells with regions that each include a plurality of banks of memory cells, I/O areas extending across the array of memory cells, the I/O areas may include a plurality of terminals configured to route signals to and from the array of memory cells, and a plurality of channels positioned in the I/O areas of the array of memory cells, each of the channels may be coupled with a region of the array of memory cells and may be configured to communicate signals between the plurality of banks of memory cells in the region with a host device.

In some examples, the memory device may further include a plurality of channel interfaces positioned in the I/O areas of the array of memory cells, signal paths couple the regions with the plurality of channel interfaces. In some examples of the memory device, the I/O areas may include TSVs configured to couple a second array of memory cells stacked on top of the array of memory cells with a channel interface.

In some examples of the memory device, a channel interface of the region may be positioned within an I/O area that bisects the region serviced by the channel interface. In some examples of the memory device, the I/O areas may include TSVs configured to couple the array of memory cells with a power node or a ground node. In some examples of the memory device, the I/O areas may occupy an area of the array of memory cells that may be devoid of memory cells. In some examples of the memory device, the array of memory cells may be bisected by two I/O areas. In some examples of the memory device, the array of memory cells may be bisected by four I/O areas.

In one example, a system may include a host device, a memory device including a memory die with a plurality of regions that may each include a plurality of banks of memory cells, and a plurality of channels configured to communicatively couple the host device and the memory device, each of the channels may be coupled with a region of the memory die and may be configured to communicate signals between the plurality of banks of memory cells in the region with the host device.

In some examples, the system may include an interface configured for bidirectional communication with the host device. In some examples of the system, the interface may be configured to communicate signals modulated using at least one of a NRZ modulation scheme or a PAM4 scheme, or both. In some examples of the system, the host device may be an example of a GPU. In some examples of the system, the memory device may be positioned in a same package as the host device.

In one example, a memory device may include an array of memory cells with a plurality of regions that each include a plurality of banks of memory cells, and a plurality of channels traversing the array of memory cells, each of the channels may be coupled to at least one region of the array of memory cells and each channel may include two or more data pins and one or more command/address pin.

In some examples of the memory device, each channel may include two data pins. In some examples of the memory device, each channel may include one command/address pin. In some examples of the memory device, each region of the array may include four banks of memory cells. In some examples of the memory device, each channel may include four data pins. In some examples of the memory device, each channel may include two command/address pins. In some examples of the memory device, each region of the array may include eight banks of memory cells. In some examples of the memory device, each bank of memory cells may be contiguous with a channel.

In some examples of the memory device, a first set of banks of each plurality may be contiguous with a channel and a second set of banks of each plurality may be contiguous with another bank and non-contiguous with a channel. In some examples, the memory device may include 128 data pins and configured with a ratio of two, four, or eight data pins per channel.

In some examples, the memory device may include one, two, three, four, or six command/address pins per channel. In some examples, the memory device may include 256 data pins and configured with a ratio of two, four, or eight data pins per channel. In some examples, the memory device may include one, two, three, four, or six command/address pins per channel. In some examples of the memory device, the array may include a plurality of memory dice that each may include a plurality of channels.

In some examples of the memory device, each memory die of the plurality may be coupled with a different channel of the plurality of channels. In some examples, the memory device may include a buffer layer coupled with array. In some examples, the memory device may include an organic substrate underlying the array.

In some examples of the memory device, the array may be configured for a pin rate of 10, 16, 20, or 24 Gbps. In some examples, the memory device may include an interface configured for bidirectional communication with a host device. In some examples of the memory device, the interface may be configured for at least one of a binary modulation signaling or pulse-amplitude modulation, or both.

In one example, a system may include at least one memory die that may include a plurality of regions that each may include a plurality of banks of memory cells, one or more channels associated with each memory die, each of the channels may be coupled to at least one region of the die of memory cells and each channel may include two or more data pins, and an organic substrate that underlies the memory die.

In some examples, the system may include a host device, and an interface configured for bidirectional communication with the host device, the interface supports at least one of a NRZ signaling or a PAM4, or both. In some examples of the system, the host device may include a GPU.

In some examples, the system may include a plurality of memory arrays that each may include 128 or 256 data pins and configured with a ratio of two, four, or eight data pins per channel. In some examples, the system may include a buffer layer positioned between the at least one memory die and the organic substrate.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As may be used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The may be used herein, the term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "layer" used herein refers to a stratum or sheet of a geometrical structure. Each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of a memory array.

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. In some examples, the substrate may be an organic build up substrate formed from materials such as ABF or BT. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine.

A processor may also be implemented as a combination of computing devices (e.g., a combination of a DSP and a microprocessor, multiple microprocessors, one or more microprocessors in conjunction with a DSP core, or any other such configuration).

In a first example, Example 1, a storage system can include a stack of first memory devices configured to store data, the stack including multiple memory die of a first storage type, and a logic die. The logic die can include second memory of a second storage type, and an interface circuit. The interface circuit can be configured to receive a multiple of memory requests from an external host using an external bus, to relay data between the external host and multiple channels of the stack of first memory devices via the second memory, to provide an indication of a data error on a first output bit of a corresponding channel during a single clock cycle of multiple clock cycles used to exchange the data with the corresponding channel of the stack of first memory devices in response to a first respective memory request of the multiple on memory requests, to provide an indication of data readiness associated with a second respective memory request of the multiple of memory requests, and to provide a first index configured to identify data associated with the second respective memory request.

In Example 2, the second memory of Example 1 optionally comprises a list configured to store multiple indexes including the first index.

In Example 3, the indication of data readiness of any one or more of Examples 1-2 optionally is encoded on the first output bit during the multiple clock cycles.

In Example 4, the indication of data readiness of any one or more of Examples 1-3 optionally includes an indication data is not ready.

In Example 5, the indication of data readiness of any one or more of Examples 1-4 optionally includes an indication data is ready.

In Example 6, the first index of any one or more of Examples 1-5 optionally is encoded on the first output bit during the multiple clock cycles.

In Example 7, the first storage type of any one or more of Examples 1-6 optionally is dynamic random-access memory (DRAM).

In Example 8, the second storage type of any one or more of Examples 1-7 optionally is static random-access memory (SRAM).

In Example 9, is a method of operating a memory package having a logic die and stack of memory devices, the memory package can be configured to communicate with a host using multiple independent channels. The method can include receiving multiple memory access requests for a channel at the logic die, returning first data to the host in response to a first memory access request of the multiple memory access requests, returning an indication of data not ready to the host in response to a second memory access request of the multiple memory access requests for second data, returning a first index to the host with the indication of data not ready, returning an indication data is ready with third data in response to a third memory access request of the multiple memory access requests, returning the first index with the indication of data ready, and returning the second data to the host in response to the indication of data ready and the first index returned with the third memory access request.

In Example 10, the returning an indication of data not ready of any one or more of Examples 1-9 optionally includes encoding the indication of data not ready on a single output bit of the channel over a first single cycle of a burst of cycles used to exchange data of a respective memory access request of the multiple memory access requests with the host.

In Example 11, the returning an indication of data ready of any one or more of Examples 1-10 optionally includes encoding the indication of data ready on the single output bit of the channel over a second single cycle of the burst of cycles.

In Example 12, the returning the first index of any one or more of Examples 1-11 optionally includes encoding the first index on the single output bit of the channel over multiple cycles of the burst of cycles.

In Example 13, the multiple cycles of any one or more of Examples 1-12 optionally does not include the first single cycle or the second single cycle.

In Example 14, the method of any one or more of Examples 1-13 optionally includes returning a data error (DERR) indication when the memory package is unable to service a memory access request of the multiple memory access requests, wherein the DERR indication is encoded on the single output bit.

In Example 15, a method of operating a host configured to exchange information using multiple independent channels of a memory package including a stack of memory devices can include sending a plurality of memory access requests to the memory package using a single channel, receiving first data via the single channel in response to a first memory access request of the plurality of memory access requests, receiving an indication of data not ready via the single channel in response to a second memory access request of the plurality of memory access requests for second data, receiving a first index with the indication of data not ready, receiving an indication data is ready with third data via the single channel in response to a third memory access request of the plurality of memory access requests, receiving the first index with the indication of data ready, and receiving the second data via the single channel in response to the indication of data ready and the first index received in response to the third memory access request.

In Example 16, the receiving an indication of data not ready of any one or more of Examples 1-15 optionally includes decoding the indication of data not ready on a single output bit of the single channel over a first single cycle of a burst of cycles, the burst of cycles used to exchange data of a respective memory access request of the plurality of memory access requests between the host and the memory package.

In Example 17, the receiving an indication of data ready of any one or more of Examples 1-16 optionally includes decoding the indication of data ready on the single output bit of the single channel over a second single cycle of the burst of cycles.

In Example 18, the receiving the first index of any one or more of Examples 1-17 optionally includes decoding the first index on the single output bit of the single channel over a plurality of cycles of the burst of cycles.

In Example 19, the plurality of cycles of any one or more of Examples 1-18 optionally does not include the first single cycle or the second single cycle.

In Example 20, the method of any one or more of Examples 1-11 optionally includes receiving a data error (DERR) indication when the memory package is unable to service a memory access request of the plurality of memory access requests, wherein the DERR indication is encoded on the single output bit.

Example 21 can include or use, or can optionally be combined with any portion or combination of any portions of any one or more of Examples 1 through 20 to include or use, subject matter that can include means for performing any one or more of the functions of Examples 1 through 20, or a machine-readable medium including instructions that, when performed by a machine, cause the machine to perform any one or more of the functions of Examples 1 through 20.

What is claimed is:

1. A system comprising:
a first memory die of a first storage type;
a second memory die of a different second storage type; and
an interface circuit configured to:
   determine if a first request from an external host can be serviced by one of the first memory die and the second memory die;
   in response to determining the first request can be serviced by the first memory die, identify data associated with the first request and provide the data to the host; and
   in response to determining the first request cannot be serviced by the first memory die but can be serviced by the second memory die, assign a request index for the first request and provide a data error signal with the request index to the host.

2. The system of claim 1, wherein the interface circuit is further configured to:
   coordinate transfer of first data associated with the first request from the second memory die to the first memory die; and
   provide, together with other data associated with a second request, a data readiness indication to the host about availability of the first data to the host.

3. The system of claim 2, wherein the interface circuit is further configured to:
   receive a third request from the host, the third request including the request index for the first request and, in response, provide the first data from the first memory die to the host.

4. The system of claim 1, wherein the first memory die comprises a static random-access memory (SRAM) die and the second memory die comprises a dynamic random-access memory (DRAM) die.

5. The system of claim 1, wherein the interface circuit is configured to use a physical data error (DERR) output to provide the data error signal to the host.

6. The system of claim 1, further comprising the host, wherein the host is configured to provide the first request to the interface circuit and, in response to receiving the data error signal, the host is configured to use the request index in a subsequent request, provided to the interface circuit, for data corresponding to the first request.

7. The system of claim 6, wherein the host is configured to provide a second request to the interface circuit before the subsequent request, wherein the first and second requests correspond to different data in the first and/or second memory dies.

8. The system of claim 7, wherein the host is configured to receive the data error signal from the interface circuit using a physical data error (DERR) channel.

9. The system of claim 7, wherein the interface circuit is configured to provide a data readiness indication about the first request to the host together with a response to the second request.

10. A method of operating an interface circuit in a memory package that includes multiple memory devices, the method comprising:
   receiving access requests from a host device;
   determining if first and second access requests can be serviced by at least one of the multiple memory devices;
   providing first data in response to the first access request;
   providing a first indication of second data not ready and an index in response to the second access request for second data;
   providing a later indication of second data ready in response to a third access request; and
   receiving an access request for the second data, wherein the access request includes the index.

11. The method of claim 10, wherein providing the first indication of second data not ready includes providing a message on a physical data error (DERR) channel.

12. The method of claim 10, wherein receiving the access requests includes using a first channel, and wherein providing the first data, the first indication of second data not ready, and the later indication of second data ready, include using the same first channel.

13. The method of claim 10, wherein providing the first indication of second data not ready includes using a single cycle of a first burst of cycles used to communicate data from the memory package to the host device.

14. The method of claim 13, wherein providing the index includes using one or multiple cycles of the first burst of cycles.

15. The method of claim 10, wherein providing the first data in response to a first access request includes retrieving data from a static random-access memory (SRAM) die.

16. The method of claim 15, further comprising, responsive to the second access request, retrieving the second data from a DRAM die and storing the second data in the SRAM die, and then providing the later indication of second data ready.

17. The method of claim 10, further comprising pending responses to multiple access requests for respective data when the data is unavailable from a cache in the memory package, and assigning a unique respective index for each pended request.

18. The method of claim 17, further comprising providing, to the host device, respective indications of data not ready and the respective indexes in response to the multiple access requests.

19. A data storage system comprising:
   first memory devices of a first storage type and configured to store data; and
   a logic die including:
   a cache memory of a second storage type; and
   an interface circuit configured to:
   in response to a first memory request from an external host device, determine that the first memory request cannot be serviced by the cache memory and provide an indication of a data error on a first channel used to exchange data between the host device and the corresponding channel of the first memory devices;
   provide an indication of data readiness associated with a second memory request from the external host; and
   provide a first index configured to identify data associated with the second memory request.

20. The data storage system of claim 19, wherein the first memory devices comprise a stack of dynamic random-access memory (DRAM) dies, and wherein the cache memory comprises a static random-access memory (SRAM) die.

* * * * *